(12) United States Patent
Cho

(10) Patent No.: US 7,732,934 B2
(45) Date of Patent: Jun. 8, 2010

(54) SEMICONDUCTOR DEVICE HAVING CONDUCTIVE ADHESIVE LAYER AND METHOD OF FABRICATING THE SAME

(75) Inventor: Yun-rae Cho, Guri-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 337 days.

(21) Appl. No.: 11/806,586

(22) Filed: Jun. 1, 2007

(65) Prior Publication Data

US 2007/0296082 A1  Dec. 27, 2007

(30) Foreign Application Priority Data

Jun. 23, 2006  (KR)  ...................... 10-2006-0057092

(51) Int. Cl.
*H01L 23/48* (2006.01)
*H01L 23/52* (2006.01)

(52) U.S. Cl. ........................ 257/783; 257/737; 257/778; 257/E23.021

(58) Field of Classification Search ................ 257/753, 257/737, E21.506, E23.01, 783, 773, 786, 257/778, E23.021
See application file for complete search history.

(56) References Cited

U.S. PATENT DOCUMENTS

| | | | |
|---|---|---|---|
| 5,839,188 A | | 11/1998 | Pommer |
| 5,874,782 A | * | 2/1999 | Palagonia ................... 257/778 |
| 7,135,780 B2 | * | 11/2006 | Jiang ........................... 257/783 |
| 7,615,864 B2 | * | 11/2009 | Ito .............................. 257/736 |
| 2001/0023993 A1 | * | 9/2001 | Kawashima ................ 257/780 |
| 2002/0074641 A1 | * | 6/2002 | Towle et al. ................ 257/692 |
| 2005/0133914 A1 | * | 6/2005 | Ito .............................. 257/737 |
| 2009/0039495 A1 | * | 2/2009 | Yamashita et al. .......... 257/690 |

FOREIGN PATENT DOCUMENTS

| | | |
|---|---|---|
| KR | 10-2003-0004741 | 1/2003 |
| KR | 10-2003-0090481 | 11/2003 |

* cited by examiner

*Primary Examiner*—Nitin Parekh
(74) *Attorney, Agent, or Firm*—Harness, Dickey & Pierce, P.L.C.

(57) ABSTRACT

In a semiconductor device, a semiconductor substrate may include a plurality of first conductive pads. An insulating isolation layer may be on the semiconductor substrate so as to separate the first conductive pads. A package substrate may include a plurality of second conductive pads. A conductive adhesive layer may connect the first conductive pads and the second conductive pads.

13 Claims, 6 Drawing Sheets

SEMICONDUCTOR DEVICE HAVING CONDUCTIVE ADHESIVE LAYER AND METHOD OF FABRICATING THE SAME

PRIORITY STATEMENT

This application claims the benefit of priority to Korean Patent Application No. 10-2006-0057092, filed on Jun. 23, 2006, in the Korean Intellectual Property Office, the entire contents of which are incorporated herein in their entirety by reference.

BACKGROUND

1. Field

Example embodiments relate to a semiconductor device and/or a method of fabricating the same, and for example, to an assembled and packaged semiconductor device and/or a method of assembling and packaging the same.

2. Description of Related Art

A plurality of semiconductor devices may be formed simultaneously using a semiconductor substrate, and/or the plurality of semiconductor devices may be assembled and packaged to come out as products. For example, a conventional semiconductor package may use wire bonding. Wires may be bonded to connect semiconductor chips and a package substrate. However, a reliability of the wire bonding may be deteriorated as a size of the semiconductor chips decreases.

A conventional wafer level package may use redistributed patterns. However, a conventional method of forming redistributed patterns on a semiconductor substrate may increase fabrication costs, and/or may be difficult to employ in assembling and packaging processes. Because the semiconductor chip may be exposed to the outside, the semiconductor chip may be vulnerable to external impacts.

SUMMARY

Example embodiments may provide a semiconductor device having higher reliability.

Example embodiments may provide a method of fabricating the semiconductor device more economically.

According to an example embodiment a semiconductor device may include a semiconductor substrate, an insulating isolation layer, a package substrate, and/or a conductive adhesive layer. The semiconductor substrate may include a plurality of first conductive pads. The insulating isolation layer may be on the semiconductor substrate, and/or may separate the first conductive pads. The package substrate may include a plurality of second conductive pads. The conductive adhesive layer may connect the first conductive pads and the second conductive pads.

According to an example embodiment, the package substrate may include a first surface and a second surface, the second surface contacting the insulating isolation layer. The second conductive pads may be exposed to the first surface and the second surface.

According to an example embodiment, the conductive adhesive layer may attach the semiconductor substrate and the package substrate, and/or may include a plurality of interconnection lines separated from each other by the insulating layer and/or connecting the first conductive pads and the second conductive pads.

According to an example embodiment, a shape of the interconnection lines may be confined by the insulating isolation layer.

According to an example embodiment, the semiconductor device may include a passivation layer interposed between the conductive adhesive layer and the semiconductor substrate. The passivation layer may expose the first conductive pads.

According to an example embodiment, the semiconductor device may include a plurality of external terminals on the first surface of the package substrate. The external terminals may be electrically connected to the second conductive pads respectively.

According to another example embodiment a method of fabricating a semiconductor device may include forming insulating isolation layer on a semiconductor substrate including a plurality of first conductive pads to separate the first conductive pads. A package substrate including a plurality of second conductive pads and a conductive adhesive layer may be formed. The first conductive pads and the second conductive pads may be connected through the conductive adhesive layer.

According to an example embodiment, the package substrate may include a first surface and a second surface. The second conductive pads may be formed to be exposed to the first surface and the second surface. The conductive adhesive layer may be on the second surface, and/or the conductive adhesive layer may be connected to the second conductive pads.

According to an example embodiment, the method may include attaching the package substrate and the semiconductor substrate such that the second surface of the package substrate contacts the insulating isolation layer.

According to an example embodiment, the forming an insulating isolation layer step may include forming a photosensitive material layer on the semiconductor substrate, and/or patterning the photosensitive material layer to separate the first conductive pads.

According to an example embodiment, the attaching the package substrate and the semiconductor substrate step may include placing the package substrate on the semiconductor substrate such that the second surface of the package substrate contacts the insulating isolation layer, and applying pressure on the package substrate, and/or curing the conductive adhesive layer between the package substrate and the semiconductor substrate.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
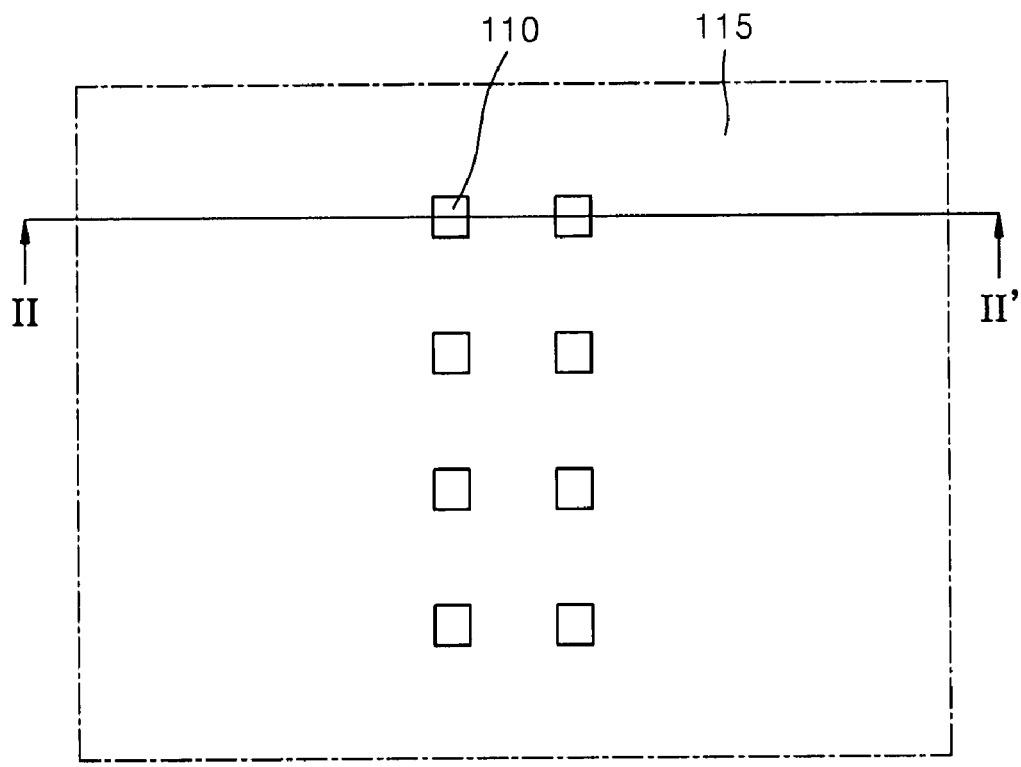
FIGS. 1 and 2 are respectively a plan view and a sectional view illustrating a semiconductor substrate in a semiconductor device and a method of fabricating the same, according to an example embodiment.

Example embodiments will now be described more fully hereinafter with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions are exaggerated for clarity.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

In example embodiments, a semiconductor device may include a semiconductor chip or a semiconductor package. In example embodiments, a semiconductor substrate may include a single semiconductor chip or a die, or may include a plurality of semiconductor chips. For convenience of explanation, the semiconductor substrate will be explained with reference to a single semiconductor chip.

Figure 2:
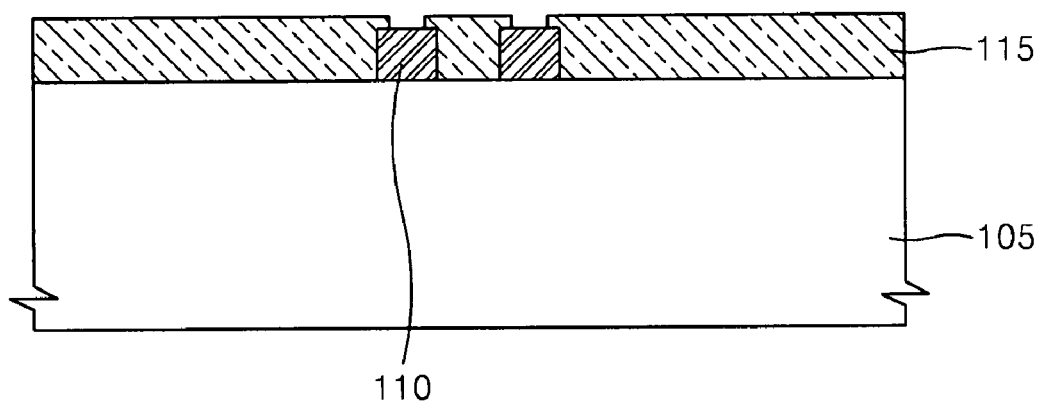

FIGS. 1 and 2 are respectively a plan view and a sectional view illustrating a semiconductor substrate in a semiconductor device and a method of fabricating the same, according to an example embodiment.

Referring to FIGS. 1 and 2, a semiconductor substrate 105 may include a plurality of first conductive pads 110. As described above, the semiconductor substrate 105 may represent a single semiconductor chip. However, the semiconductor substrate 105 may be a semiconductor wafer, and FIGS. 1 and 2 may illustrate one semiconductor chip as a part of the semiconductor wafer. For example, the semiconductor substrate 105 may be a silicon substrate, a germanium substrate, or a silicon-germanium substrate.

The semiconductor substrate 105 may include element units, for example, a transistor unit and/or capacitor unit (not shown). The first conductive pads 110 may be output terminals of the element units, and may be connected to the electrodes of the element units disposed below the first conductive pads 110. For example, the first conductive pads 110 may include at least one metal layer.

A passivation layer 115 may be selectively formed on the semiconductor substrate 105 so as to expose the first conductive pads 110. For example, a material layer covering the first conductive pads 110 may be formed, and the material layer may be patterned so as to partially expose upper parts of the first conductive pads 110, thereby forming a passivation layer 115. For example, the passivation layer 115 may include an insulating layer, for example, a silicon oxide layer and/or a silicon nitride layer.

Figure 3:
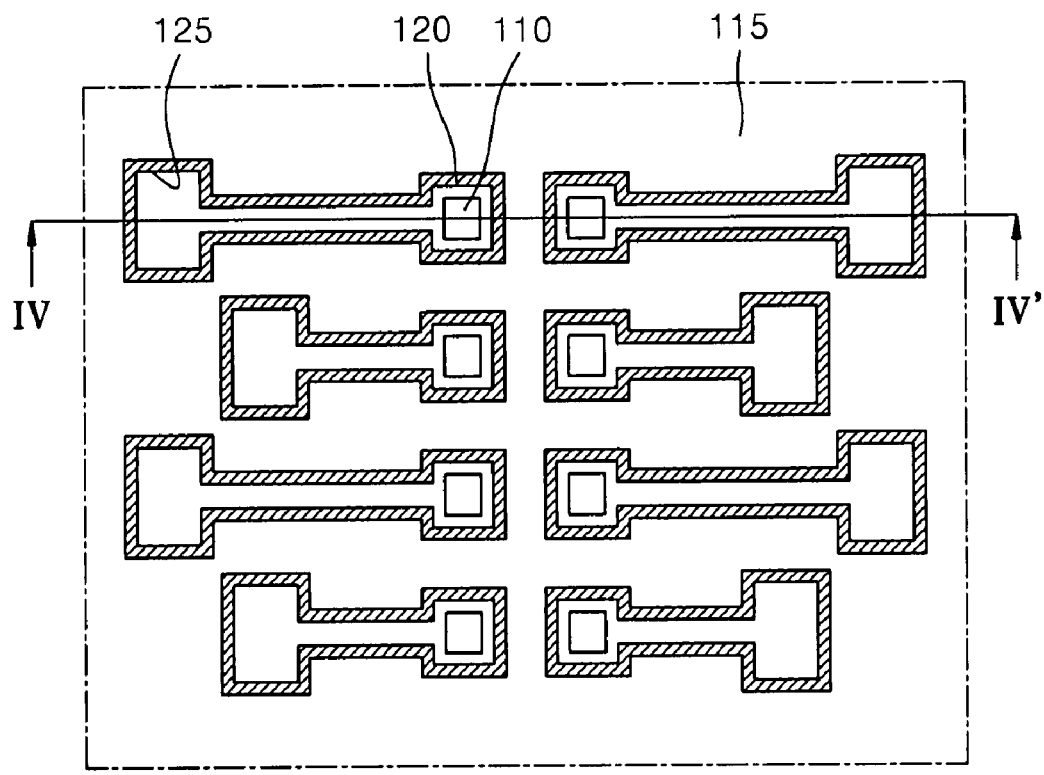
FIGS. 3 and 4 are respectively a plan view and a sectional view illustrating an insulating isolation layer in a semiconductor device and a method of fabricating the same, according to an example embodiment.
Figure 4:
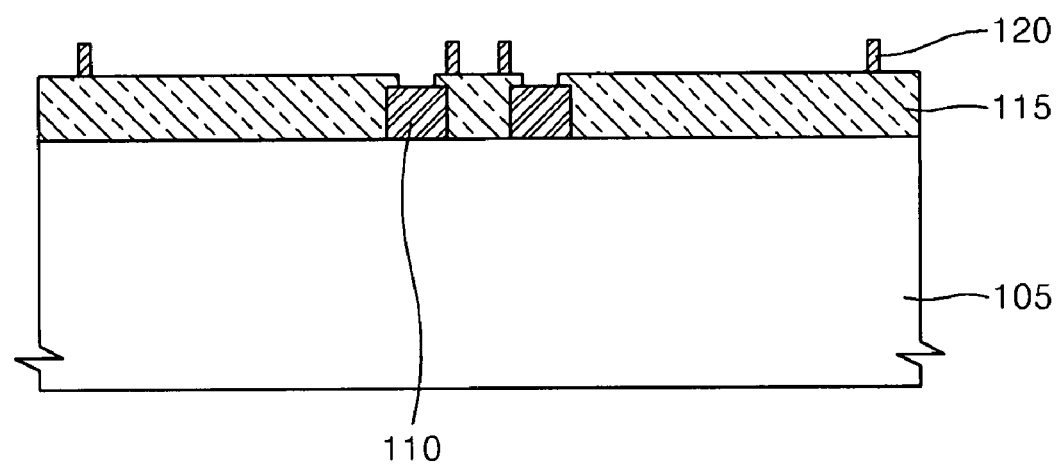

FIGS. 3 and 4 are respectively a plan view and a sectional view illustrating an insulating isolation layer in a semiconductor device and a method of fabricating the same, according to an embodiment of the present invention.

Referring to FIGS. 3 and 4, an insulating isolation layer 120 may be formed on the semiconductor substrate 105 so as to isolate the first conductive pads 110. For example, the insulating isolation layer 120 may be provided as partition walls disposed on the passivation layer 115 and surrounding the first conductive pads 110. In this case, the partition walls surrounding the first conductive pads 110 respectively may be separated from one another.

For example, the insulating isolation layer 120 may include a photosensitive material layer, for example, a photosensitive polyimide layer. For example, a photosensitive material layer may be formed on the semiconductor substrate 105, and the photosensitive material layer may be patterned so as to isolate the first conductive pads 110, thereby forming the insulating isolation layer 120. Accordingly, a trench 125 surrounding the first conductive pad 110 may be formed inside the insulating isolation layer 120. However, the insulating isolation layer 120 may be formed as another different insulating layer.

The insulating isolation layer 120 may confine an interconnection line (for example, 220a of FIG. 11) of a conductive adhesive layer. For example, the trench 125 may be formed in the same shape as that of the interconnection line 220a of FIG. 11. For example, the trench 125 may be formed to extend toward the edge portion of the semiconductor substrate 105 from the first conductive pad 110. The insulating isolation layer 120 may be a desired, or alternatively, a predetermined thickness.

The semiconductor substrate 105 may be a semiconductor wafer, and in this case, the insulating isolation layer 120 may be formed simultaneously in a plurality of semiconductor devices or semiconductor chips. Because the insulating isolation layer 120 may be formed using semiconductor chip manufacturing equipment without a need for additional manufacturing equipment in existing assembling and packaging lines, the method of fabricating the semiconductor chip and/or wafer may provide a cost-saving effect.

Figure 5:
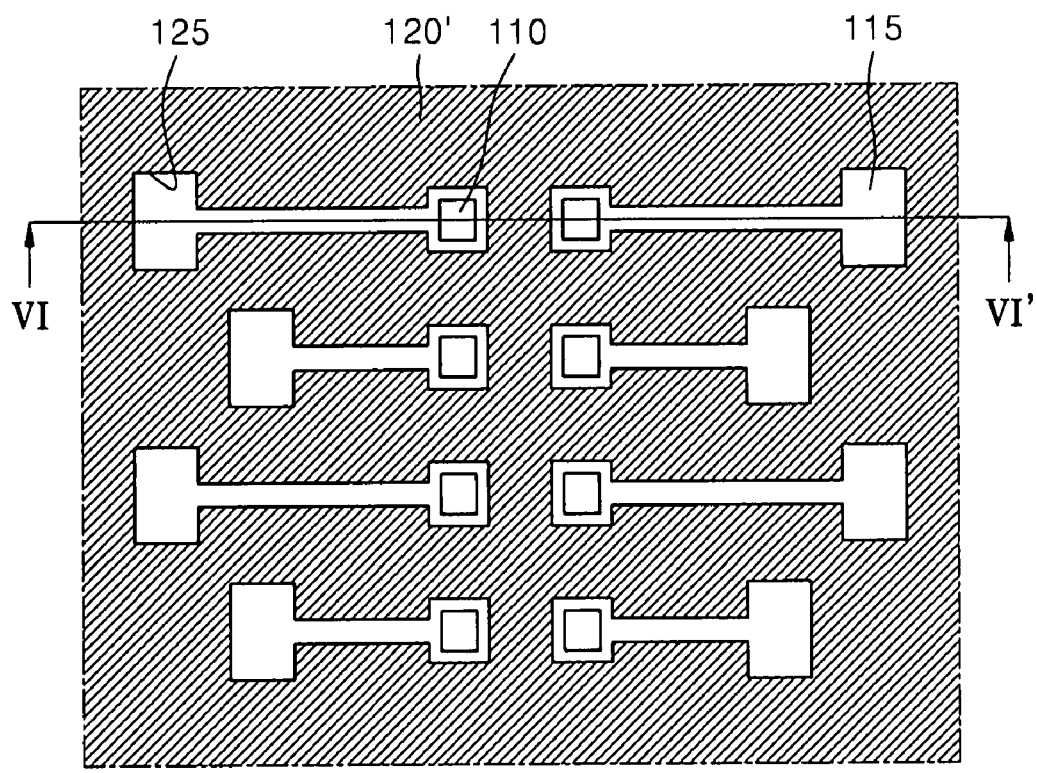
FIGS. 5 and 6 are respectively a plan view and a sectional view illustrating an insulating isolation layer in a semiconductor device and a method of fabricating the same, according to another example embodiment.
Figure 6:
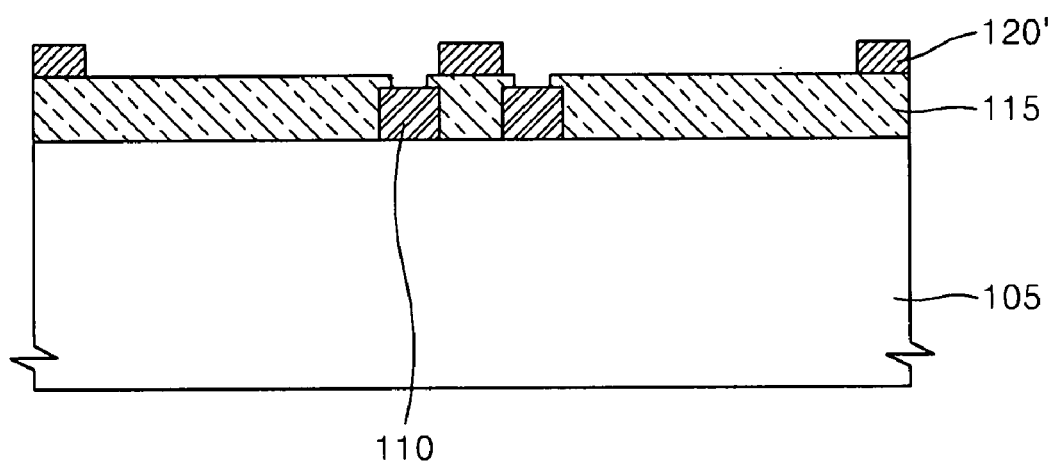

FIGS. 5 and 6 are respectively a plan view and a sectional view illustrating an insulating isolation layer in a semiconductor device and a method of fabricating the same, according to another example embodiment.

Referring to FIGS. 5 and 6, an insulating isolation layer 120' may be provided as a layer exposing first conductive pads 110. In this case, the photosensitive material layer may be etched to form a trench 125, thereby forming the insulating isolation layer 120'. The insulating isolation layer 120' may have a modified shape, in which the insulating isolation layer 120 of FIGS. 3 and 4 extends around the trench 125 so as to be all connected to the rear opposite sides of the trench 125. For example, the insulating isolation layer 120' may cover the entire area of the passivation layer 115 surrounding the trench 125.

Figure 7:
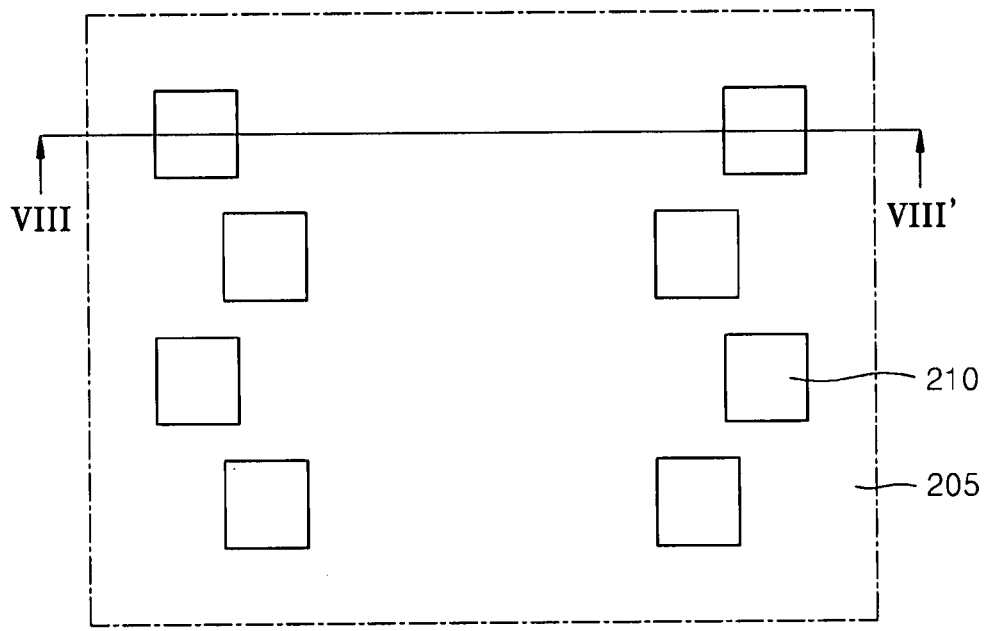
FIGS. 7 and 8 are respectively a plan view and a sectional view illustrating a semiconductor substrate in a semiconductor device and a method of fabricating the same, according to an example embodiment.
Figure 8:
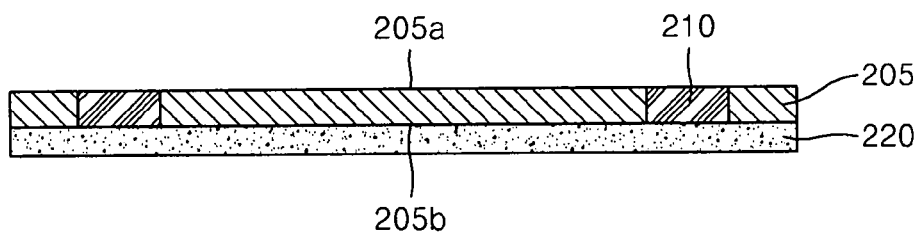

FIGS. 7 and 8 are respectively a plan view and a sectional view illustrating a package substrate in a semiconductor device and a method of fabricating the same, according to an example embodiment.

Referring to FIGS. 7 and 8, the package substrate 205 may include an upper surface 205a and a lower surface 205b. In example embodiments, the upper surface 205a may be referred to as a first surface, and the lower surface 205b may be referred to as a second surface. The package substrate 205 may include a plurality of second conductive pads 210 exposed to the upper surface 205a and the lower surface 205b. A conductive adhesive layer 220 may be formed on the lower surface 205b of the package substrate 205 to be connected to the second conductive pads 210.

For example, the package substrate 205 may be a printed circuit board, and/or the second conductive pads 210 may be circuit interconnections. The second conductive pads 210 are illustrated as a single layer in FIG. 8, but metal pads (not shown) may be respectively formed on the upper surface 205a and the lower surface 205b. The metal pads may be connected through via plugs (not shown) penetrating the package substrate 205. Therefore, the second conductive pads 210 are not limited to the shape of FIG. 8, and/or may be formed in various shapes to be exposed to desired, or alternatively, predetermined portions of the upper surface 205a and the lower surface 205b respectively.

The second conductive pads 210 may be disposed on edge portions of the package substrate 205. For example, the second conductive pads 210 may be disposed to partially overlap edge portions of the trenches 125 (for example, the trenches 125 as shown in FIG. 3) of the insulating isolation layer. The shape of the second conductive pads 210 and the shape of the edge portion of the insulating isolation layer 120 may be similar, but the shape of the second conductive pads 210 and the shape of the edge portion of the insulating isolation layer 120 are not limited thereto.

The conductive adhesive layer 220 may be attached the semiconductor substrate 105 (for example, the semiconductor substrate 105 of FIG. 4 or FIG. 6) and the package substrate 205. For example, the conductive adhesive layer 220 may include metal epoxy, for example, silver (Ag) epoxy. The conductive adhesive layer 220 may be adhesive material and/or may have a high electric conductivity. The conductive adhesive layer 220 may have a desired viscosity, or alternatively, a viscosity appropriate to enable the conductive adhesive layer 220 to be deformed as a desired, or alternatively, a predetermined pressure is applied.

Figure 9:
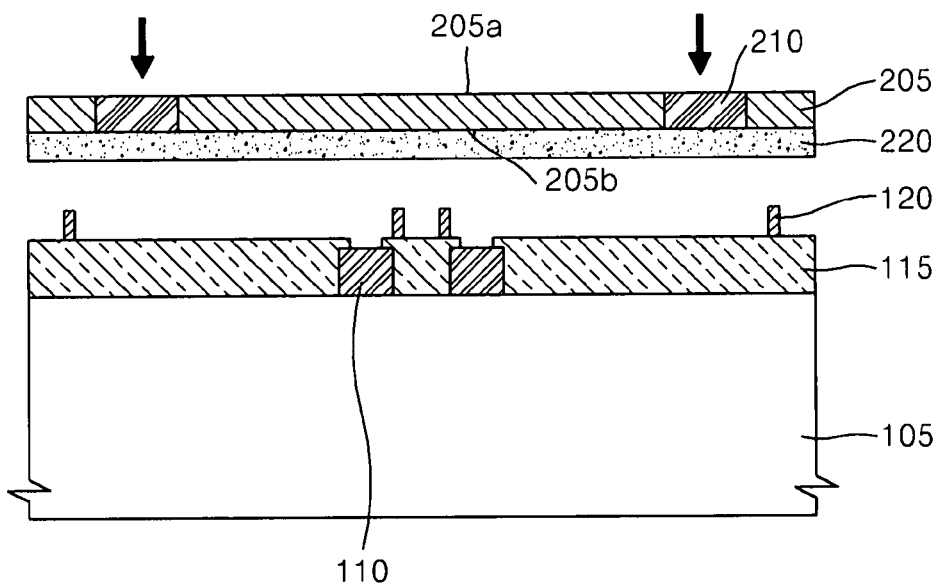
FIG. 9 is a sectional view illustrating displacement of a semiconductor substrate and a package substrate in a semiconductor device and a method of fabricating the same, according to an example embodiment.

FIG. 9 is a sectional view illustrating displacement of a semiconductor substrate and a package substrate in a semiconductor device and a method of fabricating the same, according to an example embodiment.

Referring to FIG. 9, the package substrate 205 may be disposed on the semiconductor substrate 105 such that the lower surface 205b of the package substrate 205 is directed toward the insulating isolation layer 120. Pressure may be applied to the semiconductor substrate 105 and/or the package substrate 205. For example, because the semiconductor substrate 105 may be provided in a size of a single semiconductor chip, a semiconductor wafer may be cut down and divided in a size of a semiconductor chip after the insulating isolation layer 120 is formed.

Figure 10:
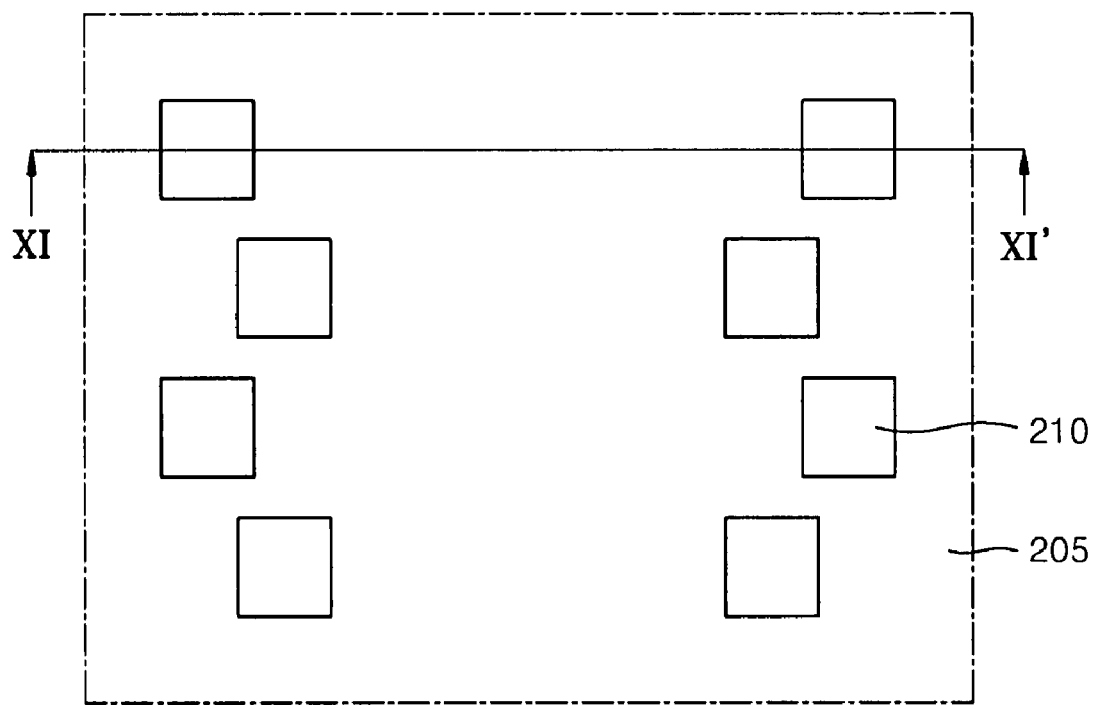
FIGS. 10 and 11 are respectively a plan view and a sectional view illustrating attaching a semiconductor substrate and a package substrate in a semiconductor device and a method of fabricating the same, according to an example embodiment.
Figure 11:
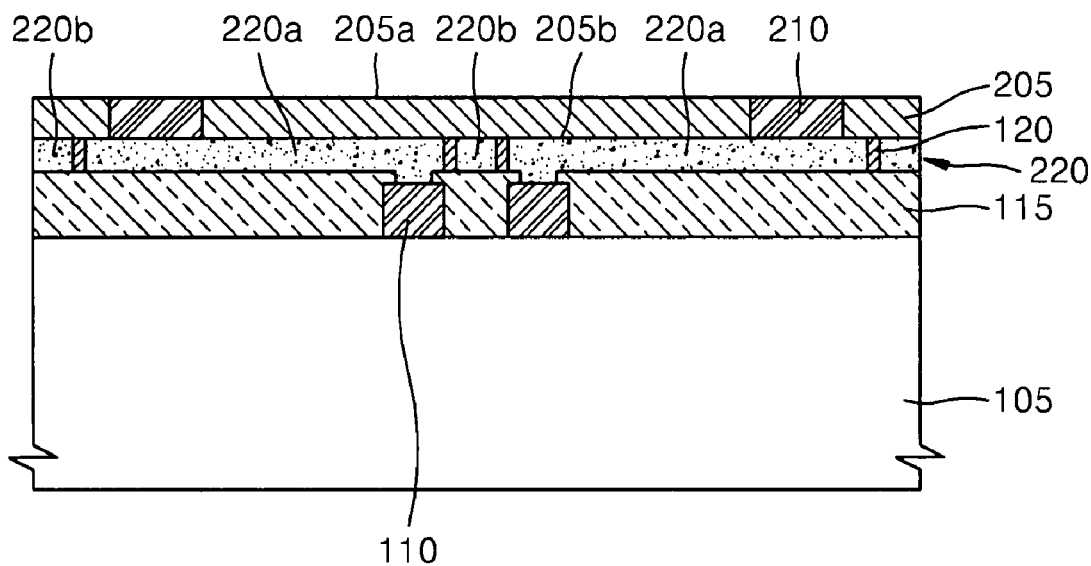

FIGS. 10 and 11 are respectively a plan view and a sectional view illustrating attachment of a semiconductor substrate and a package substrate in a semiconductor device and a method of fabricating the same, according to an example embodiment.

Referring to FIGS. 10 and 11, the package substrate 205 and the semiconductor substrate 105 may be attached such that the lower surface 205b of the package substrate 205 contacts the insulating isolation layer 120. More particularly, the lower surface 205b of the package substrate 205 is attached to a passivation layer 115 and first conductive pads 110 by the conductive adhesive layer 220. The passivation layer 115 may be interposed between the semiconductor substrate 105 and the conductive adhesive layer 220.

In the attaching procedure, the insulating isolation layer 120 may penetrate through into the conductive adhesive layer 220, and/or an excessive portion of the conductive adhesive layer 220 may come out from between the semiconductor substrate 105 and the package substrate 205. The amount of the conductive adhesive layer 220, which comes out of the semiconductor substrate 105 and the package substrate 205, may depend on a thickness of the insulating isolation layer 120. The portion of the conductive adhesive layer 220, which comes out from between the semiconductor substrate 105 and the package substrate 205, may be removed. The remaining conductive adhesive layer 220 may be cured by heat.

A plurality of interconnection lines 220a, which connect the first conductive pads 110 and the second conductive pads 210, may be formed inside the insulating isolation layer 120, for example, the plurality of interconnection line 220a may be a portion of the conductive adhesive layer 220 filling trenches 125. The interconnection lines 220a may be connected to the first conductive pads 110, and/or may extend to edge portions of the semiconductor substrate 105 so as to be connected to the second conductive pads 210.

Accordingly, the first conductive pads 110 and the second conductive pads 210 may be electrically connected. Because the insulating isolation layer 120 may contact the package substrate 220 on its upper surface, and/or contact the passivation layer 115 on its lower surface, the plurality of the interconnection lines 220a may be separated and insulated from one another. For example, the interconnection lines 220a may be surrounded by the insulating isolation layer 120.

A dummy pattern 220b may be formed in a portion of the conductive adhesive layer 220 filling the outside of the insulating isolation layer 120. The dummy pattern 220b may function to widen an attached region of the semiconductor substrate 105 and the package substrate 205. However, the dummy pattern 220b may be separated from the interconnection lines 220a by the insulating isolation layer 120.

However, another example embodiment may not include the dummy pattern 220b in the insulating isolation layer 120', as shown in another example embodiment shown in FIGS. 5 and 6. Another example embodiment may not include the dummy pattern 220b because the insulating isolation layer 120' may be formed in the portion of the dummy pattern 220b. In another example embodiment, a larger amount of excessive conductive adhesive layer 220 may be pushed out between the semiconductor substrate 105 and the package substrate 205 and/or removed. Accordingly, an example embodiment as shown in FIGS. 3 and 4 may provide a stronger adhesive force between the package substrate 205 and the semiconductor substrate 105 than another example embodiment as shown in FIGS. 5 and 6.

The interconnection lines 220a may function to redistribute the first conductive pads 110 to the second conductive pads 210. Because the interconnection lines 220a are separated by the insulating isolation layer 120, and/or are connected to the first and second conductive pads 110 and 210 by adhesive force, the interconnection lines 220a may provide higher electrical connection reliability than that of conventional wire bonding.

In FIGS. 10 and 11, the first conductive pads 110 may be center pads disposed at the center portion of the semiconductor substrate 105, and/or the second conductive pads 210 may be edge pads disposed at the edge portion of the semiconductor substrate 105 or the package substrate 205. Accordingly, the center pads may be redistributed to the edge pads by the interconnection lines 220a.

However, example embodiments are not limited to the arrangement as described above. Therefore, the first conductive pads 110 may be edge pads, and the second conductive pads 210 may be center pads. In this case, the edge pads may be redistributed to the center pads. For example, the 'center' of the center pads may be a relative meaning, and may refer to the position around the center of the semiconductor substrate 105, and is not limited to the center of the semiconductor substrate 105 geometrically. Similarly, the 'edge' of the edge pads may be a relative meaning, and may refer to the position around the edge of the semiconductor substrate 105, and is not limited specific portion of the edge of the semiconductor substrate 105.

The attaching procedure as show in FIGS. 10 and 11 may be provided as a part of a die attaching process in an assembling or package process. For example, the semiconductor substrate 105 (which may be referred to as a semiconductor chip or a die) may be attached to the package substrate 205. In this case, the die attaching and the redistribution may be performed simultaneously, which may reduce costs. Accordingly, the semiconductor device of FIGS. 10 and 11 may mean a die-attached semiconductor chip and/or redistributed semiconductor chip.

Figure 12:
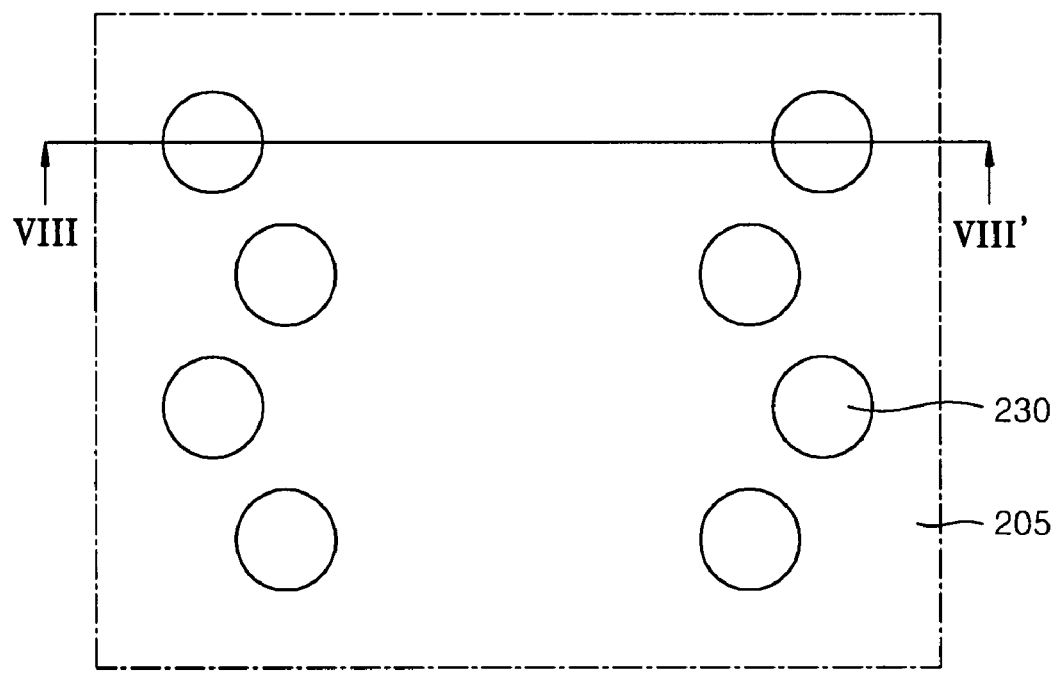
FIGS. 12 and 13 are respectively a plan view and a sectional view illustrating an external terminal in a semiconductor device and a method of fabricating the same, according to an example embodiment.
Figure 13:
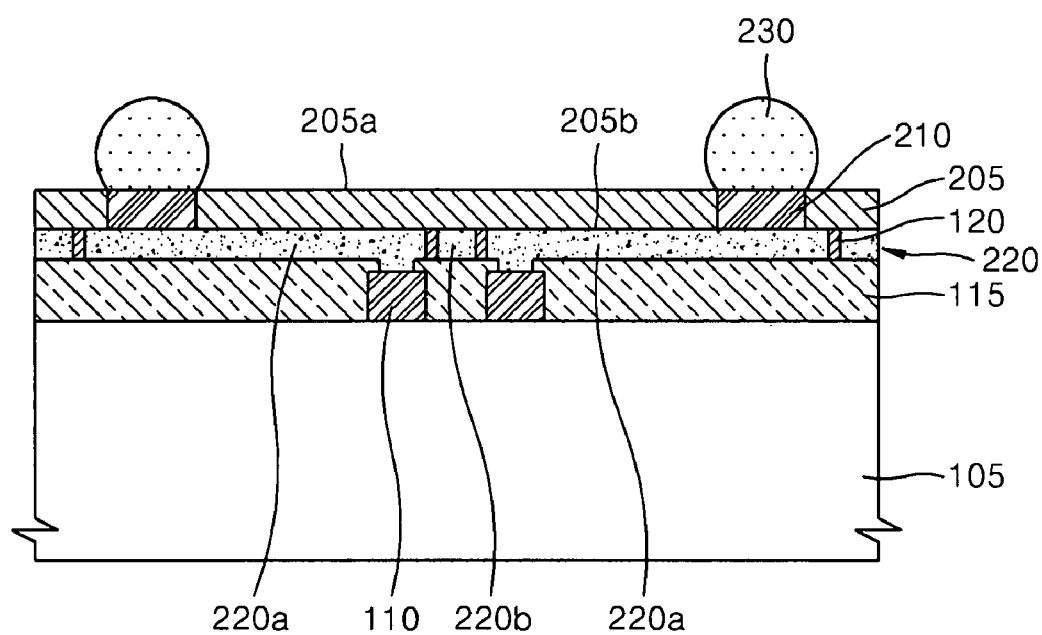

FIGS. 12 and 13 are respectively a plan view and a sectional view illustrating an external terminal in a semiconductor device and a method of fabricating the same, according to an example embodiment.

Referring to FIGS. 12 and 13, a plurality of external terminals 230 may be formed on an upper surface 205a of a package substrate 205 so as to be electrically connected to the second conductive pads 210 respectively. The external terminals 230 may be intended to connect external electronic products to semiconductor devices. For example, the external terminals 230 may include a solder ball or a conductive bump. For example, a reflow process may be performed by placing the external terminals 230 on the second conductive pads 210 to connect the external terminals 230 to the second conductive pads 210.

However, in another example embodiment, the external terminals 230 may be omitted. In this case, the second conductive pads 210 may also function as the external terminals.

Although example embodiments have been shown and described in this specification and figures, it would be appreciated by those skilled in the art that changes may be made to the illustrated and/or described example embodiments without departing from their principles and spirit.

What is claimed is:

1. A semiconductor device comprising:
   a semiconductor substrate including a plurality of first conductive pads;
   an insulating isolation layer on the semiconductor substrate separating the first conductive pads;
   a package substrate including a plurality of second conductive pads; and
   a conductive adhesive layer connecting the first conductive pads and the second conductive pads,
   wherein the conductive adhesive layer attaches the semiconductor substrate and the package substrate and includes a plurality of interconnection lines separated from each other by the insulating isolation layer and connecting the first conductive pads and the second conductive pads, and
   wherein a shape of a perimeter boundary of each of the interconnection lines in a plan view is defined by a plurality of walls of the insulating isolation layer.

2. The semiconductor device of claim 1, wherein
   the package substrate includes a first surface and a second surface, the second surface contacting the insulating isolation layer, and
   the second conductive pads are exposed to the first surface and the second surface.

3. The semiconductor device of claim 1, wherein
   the first conductive pads are on a center portion of the semiconductor substrate, and
   the interconnection lines extend from the first conductive pads toward an edge portion of the semiconductor substrate.

4. The semiconductor device of claim 3, wherein the second conductive pads are on an edge portion of the package substrate.

5. The semiconductor device of claim 1, wherein the insulating isolation layer includes a plurality of partition walls surrounding the first conductive pads respectively.

6. The semiconductor device of claim 1, wherein the insulating isolation layer is a layer exposing the first conductive pads.

7. The semiconductor device of claim 1, wherein the insulating isolation layer includes a photosensitive material layer.

8. The semiconductor device of claim 1, wherein the conductive adhesive layer includes a metal epoxy.

9. The semiconductor device of claim 1, further comprising:
a passivation layer interposed between the conductive adhesive layer and the semiconductor substrate, the passivation layer exposing the first conductive pads.

10. The semiconductor device of claim 1, further comprising:
a plurality of external terminals on a first surface of the package substrate, the plurality of external terminals electrically connected to the second conductive pads respectively.

11. The semiconductor device of claim 10, wherein the external terminals include conductive bumps.

12. The semiconductor device of claim 1, wherein the insulating isolation layer is formed on the same level as the conductive adhesive layer.

13. The semiconductor device of claim 1, wherein an upper surface of the insulating isolation layer is free of the conductive adhesive layer.

* * * * *